(12) United States Patent
Jenq et al.

(10) Patent No.: US 12,538,764 B2
(45) Date of Patent: *Jan. 27, 2026

(54) METHOD FOR WAFER TREATMENT (71) Applicant: Hua Hsu Advanced Technology Co., Ltd., Taichung (TW)

(72) Inventors: Muh-Gueng Jenq, Taichung (TW); Yung-Hsiang Lin, Taichung (TW); Thi-Yen Thu Le, Taichung (TW)

(73) Assignee: Hua Hsu Advanced Technology Co., Ltd., Taichung (TW)

( * ) Notice: Subject to any disclaimer, the term of this patent is extended or adjusted under 35 U.S.C. 154(b) by 204 days.

This patent is subject to a terminal disclaimer.

(21) Appl. No.: 18/210,077

(22) Filed: Jun. 14, 2023

(65) Prior Publication Data

US 2024/0420946 A1 Dec. 19, 2024

(51) Int. Cl.
| *H01L 21/02* | (2006.01) |
| *B05D 3/04* | (2006.01) |
| *B81C 1/00* | (2006.01) |
| *H01L 21/3213* | (2006.01) |

(52) U.S. Cl.
CPC ........ *H01L 21/02035* (2013.01); *B05D 3/044* (2013.01); *B81C 1/00531* (2013.01); *B81C 1/00539* (2013.01); *H01L 21/02002* (2013.01); *H01L 21/32135* (2013.01)

(58) Field of Classification Search
CPC ......... H01L 21/02035; H01L 21/02002; H01L 21/32135; B05D 3/044; B81C 1/00531; B81C 1/00539
USPC ....................................... 216/62, 87; 438/705
See application file for complete search history.

(56) References Cited

U.S. PATENT DOCUMENTS

| 2012/0107994 A1* | 5/2012 | Taya ...................... B23K 26/53 |
| | | 257/E21.002 |
| 2020/0176415 A1* | 6/2020 | Sakamoto ............. H01L 21/268 |
| 2021/0057402 A1* | 2/2021 | Sakamoto ............. B23K 26/00 |

FOREIGN PATENT DOCUMENTS

| TW | 201131803 A1 | 9/2011 |
| TW | 201923860 A | 6/2019 |
| TW | 202022938 A | 6/2020 |

* cited by examiner

*Primary Examiner* — Duy Vu N Deo
(74) *Attorney, Agent, or Firm* — Winston Hsu (57) ABSTRACT A method for wafer treatment is disclosed. A wafer is provided with a main surface, a surface layer, and a base layer. The surface layer is disposed between the main surface and the base layer, and the surface layer covers the base layer and exposes the main surface. Then, at least one laser process is performed to fully irradiate the main surface and the surface layer with a first laser to generate a plurality of optimized regions in the main surface and the surface layer, so that the optimized regions form at least one stress-relieving array.

9 Claims, 11 Drawing Sheets

METHOD FOR WAFER TREATMENT

BACKGROUND OF THE INVENTION

1. Field of the Invention

The present invention generally relates to a method for a wafer treatment, and in particular, is directed to a method for a wafer surface region treatment.

2. Description of the Prior Art

In the semiconductor manufacturing process, an epitaxial process is usually carried out to form an epitaxial layer on a wafer. The epitaxial layer may be a semiconductor layer and include a stress-buffering layer, a high resistance layer, a carrier transport layer, and/or a capping layer, but is not limited thereto. Then, an appropriate semiconductor process is carried out, such as a thin film process, an etching process, a patterning process, a doping process, etc., to form semiconductor devices. However, especially for the heteroepitaxy or for the homoepitaxy with a doping concentration that differs by more than two orders of magnitude, there is usually a considerable stress between the interface of the wafer surface area and the epitaxial layer when the epitaxial process is completed. This stress usually originates from a mismatch in the lattice constant or the coefficient of thermal expansion (CTE) between the wafer surface area and the epitaxial layer.

For example, in the case of forming a gallium nitride epitaxial layer on the surface area of a silicon wafer by an epitaxial process, the surface of the silicon wafer tends to bend to further cause the stress, the lattice defects or the cracks in the epitaxial layer since the lattice mismatch between silicon and gallium nitride is 17% and the thermal mismatch is 54%. The defects and stresses not only lead to large bending and brittle characteristics of the wafer after epitaxial formation to lead to difficulties in subsequent component manufacturing processes, but also affect the electron mobility, the breakdown voltage, and the transmission speed or other electronic properties of the subsequent semiconductor components at the same time, thereby reducing the reliability of semiconductor components.

In order to solve the aforementioned problems, a buffer epitaxial layer with a super lattice structure or with a lattice constant gradient structure may be disposed between the wafer and the epitaxial layer, but this will increase additional process complexity. On the other hand, the materials that can match both the wafer and the epitaxial layer are too limited, reducing the process's flexibility. Therefore, the industry needs an alternative method that can relieve the stress between the wafer and the epitaxial layer.

SUMMARY OF THE INVENTION

In order to achieve the above object, the present invention provides a method for a wafer surface region treatment. First, a wafer is provided. The wafer includes a main surface, a surface layer, and a base layer. The surface layer is disposed between the main surface and the base layer, and the surface layer covers the base layer to expose the main surface. Then, at least one laser process is carried out to comprehensively irradiate the main surface and the surface layer with a first laser to form a plurality of optimized regions on the main surface and in the surface layer, so that the optimized regions form at least one stress-relieving array. One of the optimized regions referred to in the present invention may include single crystal, polycrystalline morphology, amorphous silicon, micro-bubbles, vaporization regions, or cavities with lattice constant variation of the same material, or the lattice constant of the surface layer is adjusted to be closer to the ideal lattice constant, and a plurality of optimized regions may collectively form an optimized array.

The optimized array formed by the method for a wafer treatment of the present invention may effectively absorb or buffer the stress of the subsequent epitaxial layer disposed on the wafer surface region, and has the advantages which have simple steps and a lower cost.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
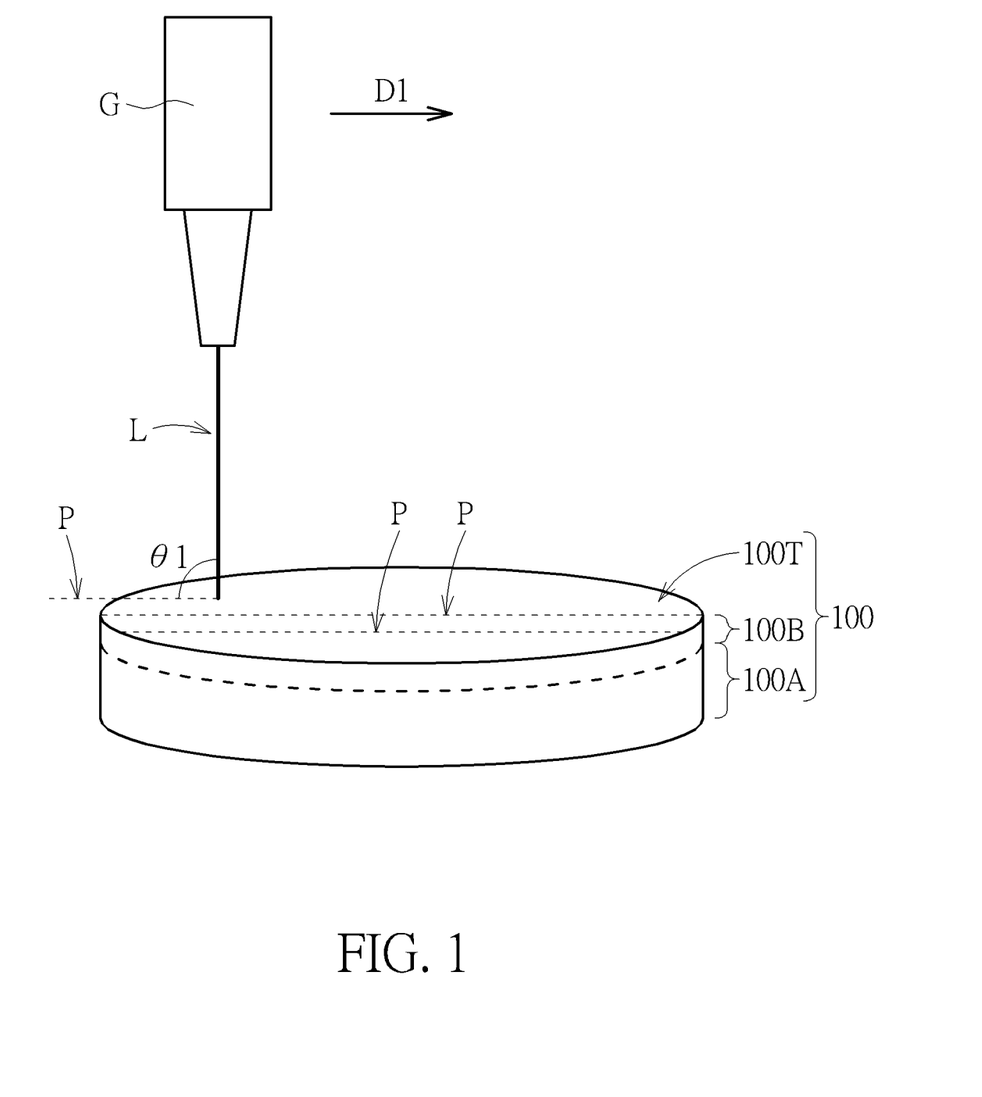
FIG. 1 illustrates a perspective schematic view of the first laser process according to an embodiment of the present invention.
Figure 2:
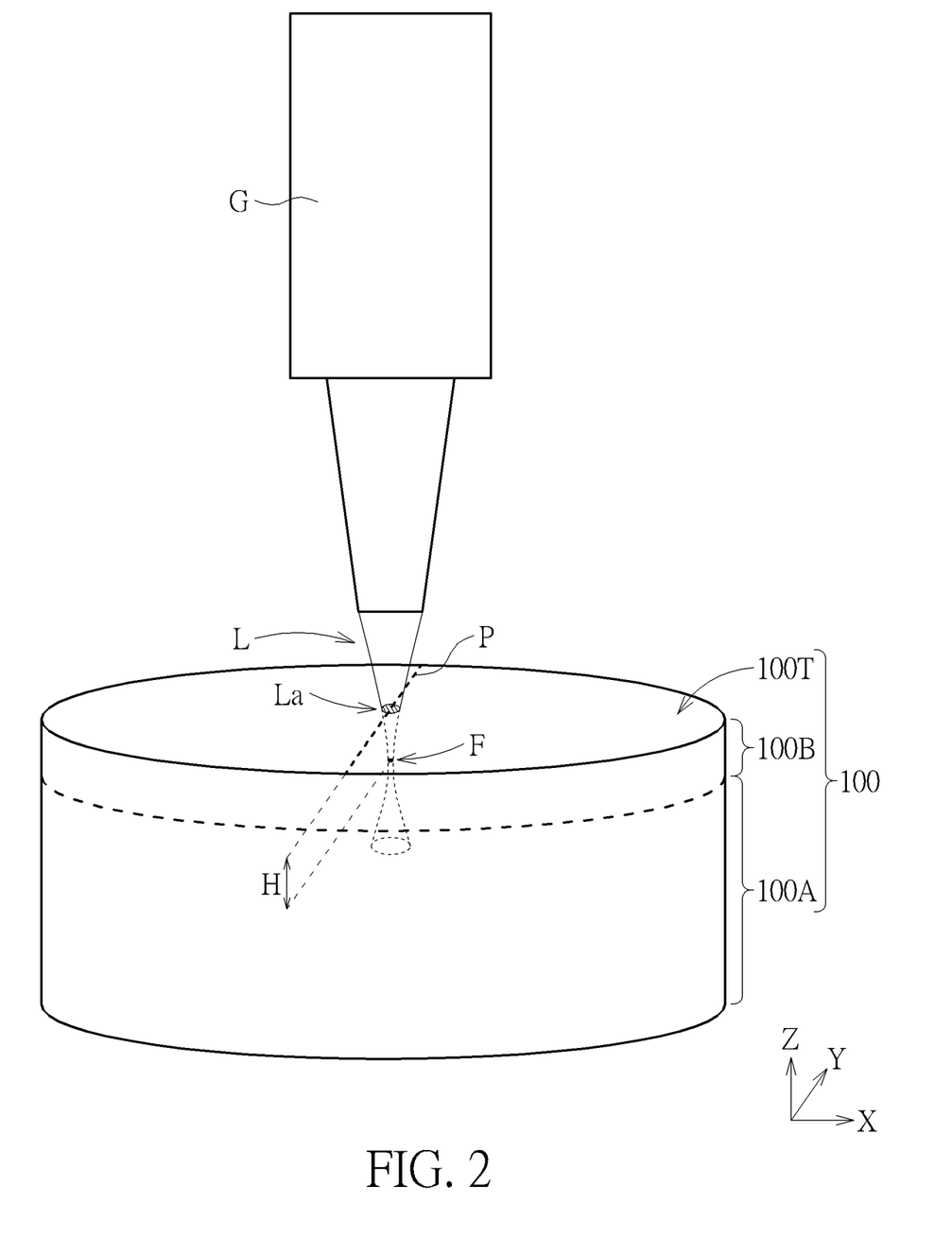
FIG. 2 illustrates a schematic perspective view of a focal offset distance H for the practice of the first laser process according to an embodiment of the present invention.

FIG. 1 to FIG. 2 illustrate perspective schematic views of the first laser process according to an embodiment of the present invention. The wafer 100 includes a main surface 100T, a surface layer 100B, and a base layer 100A, and the surface layer 100B is disposed between the main surface 100T and the base layer 100A to cover the base layer 100A. The surface layer 100B and the base layer 100A respectively include a lattice of a single crystal material or a lattice of an epitaxial material. The main surface 100T is accordingly located in the uppermost layer of the molecular lattice stack or of the atomic lattice stack in the surface layer 100B. In other words, there is no lattice stack of homogeneous atoms or of homogeneous molecules in the solid form above the main surface 100T to leave the uncovered main surface 100T exposed.

The surface layer 100B and the base layer 100A may be a single crystal material of a single material, or a composite single crystal material formed by stacking and combining different single crystal materials, such as a silicon substrate (as the base layer 100A) and re-grow the main gallium nitride layer (as the surface layer 100B), or re-grow the main gallium nitride layer (as the surface layer 100B) on the silicon carbide substrate (as the main layer 100A); or re-grow a silicon carbide epitaxial layer (as the surface layer 100B) on a silicon carbide substrate (as the base layer 100A). At this time, the base layer 100A and the surface layer 100B are of the same single crystal material but differ in lattice constants because of different magnitude orders of doping concentration, but the present invention is not limited thereto. The difference in lattice constants and in thermal expansion coefficients between the silicon substrate and gallium nitride is too large, for example, the lattice mismatch is 17%, and the thermal expansion coefficient mismatch) is 54%. When the thickness of the epitaxial layer is thicker, it is easier to cause the surface of the silicon wafer to bend, and then to generate tensile stress in the gallium nitride epitaxial layer, which may cause lattice defects or cracks. As a result, in the subsequent manufacturing of components, the electrical performance of the components is poor or it is impossible to carry out the subsequent component manufacturing processes.

The material of the wafer 100 is, for example, a single crystal wafer substrate composed of one or more elements such as silicon, diamond, silicon carbide, gallium oxide, gallium nitride, aluminum nitride, gallium arsenide, indium phosphide, sapphire, etc., or a composite single-crystal wafer in which the above-mentioned materials are stacked and combined, or a high-dielectric material is sandwiched, but the present invention is not limited thereto. On the other hand, according to different demands, the wafer 100 may be doped with dopants of different concentrations, the dopants such as group IIIA or VA elements, and the doping concentration may be $10^{16}$ atoms/cm$^3$ to $10^{19}$ atoms/cm$^3$, but the present invention is not limited thereto. The thickness of the wafer 100 may range from 0.3 mm to 1.5 mm according to the different rigidity properties of the material of the wafer 100. The thickness of the surface layer 100B herein is determined according to the main material, the doping concentration, or the epitaxial thickness of the epitaxial layer subsequently formed on the main surface 100T. For example, the lattice mismatch gets more severe if the difference between the lattice constant and thermal expansion coefficient of the wafer 100 and of the subsequent epitaxial layer (not shown) formed thereon is greater, or the difference between the doping concentration of the two is greater, so the thickness of the surface layer 100B at this time may be larger. In one embodiment, the thickness of the surface layer 100B may be 0 μm to 500 μm. It should be noted that the surface layer 100B of the wafer 100 has a substantially homogeneous structure prior to the performance of the laser process, that is, each sub-region of the surface layer 100B should have substantially the same lattice size, crystal plane, and crystal type and/or doping concentration.

Figure 4:
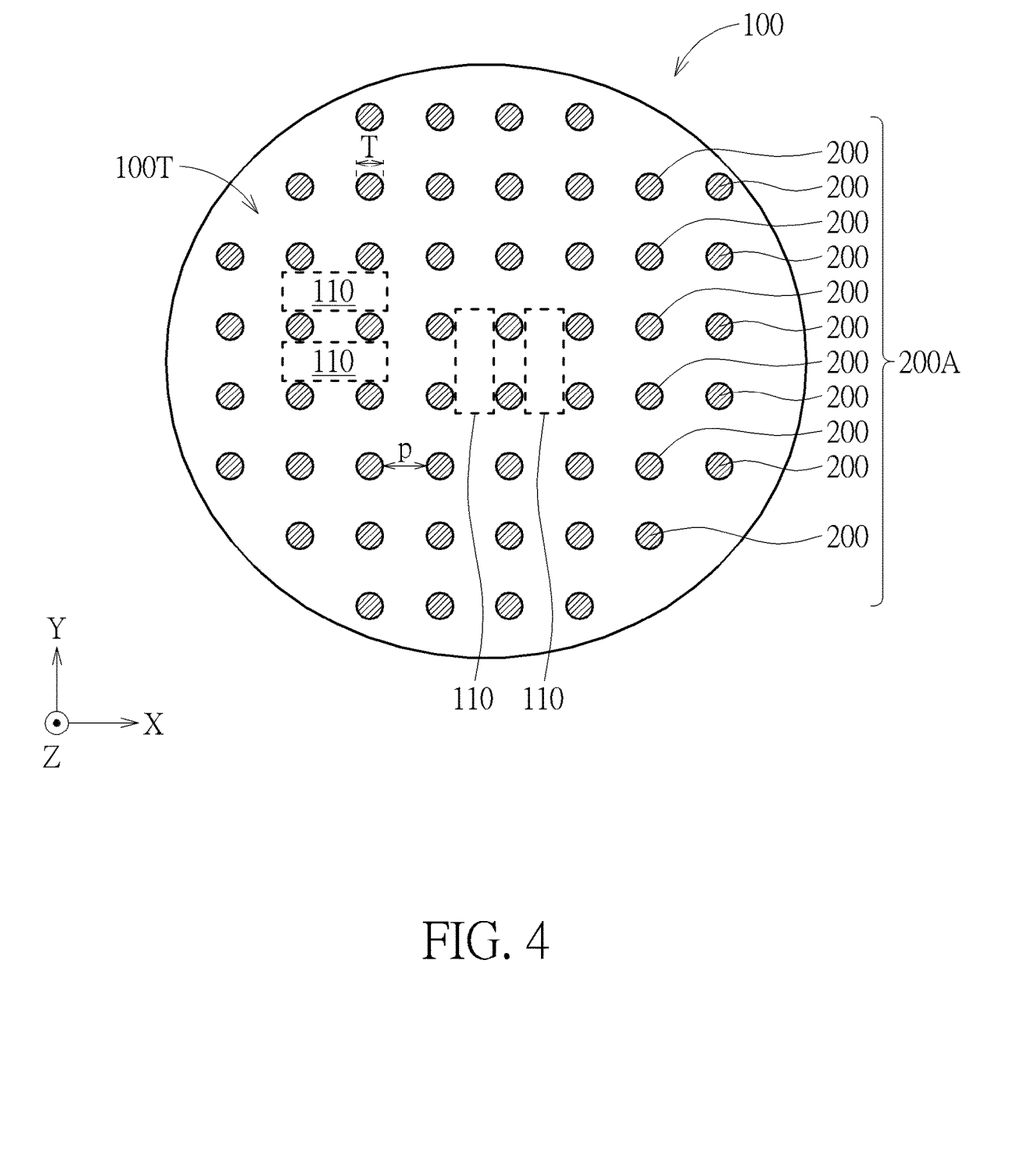
FIG. 4, FIG. 4A or FIG. 4B illustrate a top view of the wafer following the first laser process according to an embodiment of the present invention.

As shown in FIG. 1, the first laser process is carried out in this embodiment along the multi-path P parallel to the first direction D1, and the first laser process is comprehensively carried out on the main surface 100T and in the surface layer 100B underneath. For example, the laser L is generated by the laser generating device G, and the laser L regularly irradiates the main surface 100T and the surface layer 100B of the wafer 100 to form a plurality of first optimized regions on the main surface 100T and in the surface layer 100B (the first optimized regions 200 as shown in FIG. 4, in FIG. 4A, or in FIG. 4B), and a plurality of first optimized regions collectively form a first optimized array (the first optimized array 200A as shown in FIG. 4, in FIG. 4A, or in FIG. 4B).

It should be noted that the optimized regions described herein (including the first optimized regions, the second optimized regions, the third optimized regions or any other optimized regions) mean that the defect density, the void quantity, the grain boundary quantity and/or the crystal form in the regions are corrected, changed, adjusted or optimized by one or more laser processes provided by the present invention, and are different from those of other regions of the surface layer 100B which have not undergone the laser processes.

It should be noted that at least one laser process carried out in the present invention is to use the features of local thermal ablation on the surface generated by the combination of concentrated energy on laser single-point and laser pulse time to form an optimized array inside the wafer (such as in the surface layer 100B). Therefore, the laser wavelength for use in the laser process needs to have the characteristics of penetrating or partially penetrating the wafer, so that the energy of the laser is not significantly absorbed or reflected by the wafer prior to reaching the predetermined depth. For example, the laser wavelength for use in the laser process should be greater than 1300 nm when the material of the wafer is silicon.

In FIG. 1, there is a laser angle θ1 between the laser L and the main surface 100T of the wafer 100. In one embodiment, the laser angle θ1 of the first laser process may be 30° to 90°.

FIG. 2 illustrates a schematic perspective view of a focal offset distance H for the practice of the first laser process according to an embodiment of the present invention, to further enlarge the laser L emitted by the laser generating device G. It should be noted that irradiating a layer with a laser L as described herein means that the focal point F of the laser is inside the layer. For example, it means that the focal point F of the laser L emitted by the laser generating device G is set in the surface layer 100B when the laser L irradiates the surface layer 100B. The distance along the Z direction between the focal point F and the main surface 100T at this time is referred to as the focal offset distance H.

The laser-generating device G may carry out the laser process along the scanning path P or along other scanning paths (not shown). The laser L emitted by the laser generating device G has a focal point F, and the laser L has a spot La on the outermost exposed surface of the wafer 100 (for example, on the main surface 100T). It should be noted that the spot La is still on the outermost exposed surface of the wafer 100 even though the focal point F of the laser L is located below the outermost exposed surface (for example, the main surface 100T).

Figure 3:
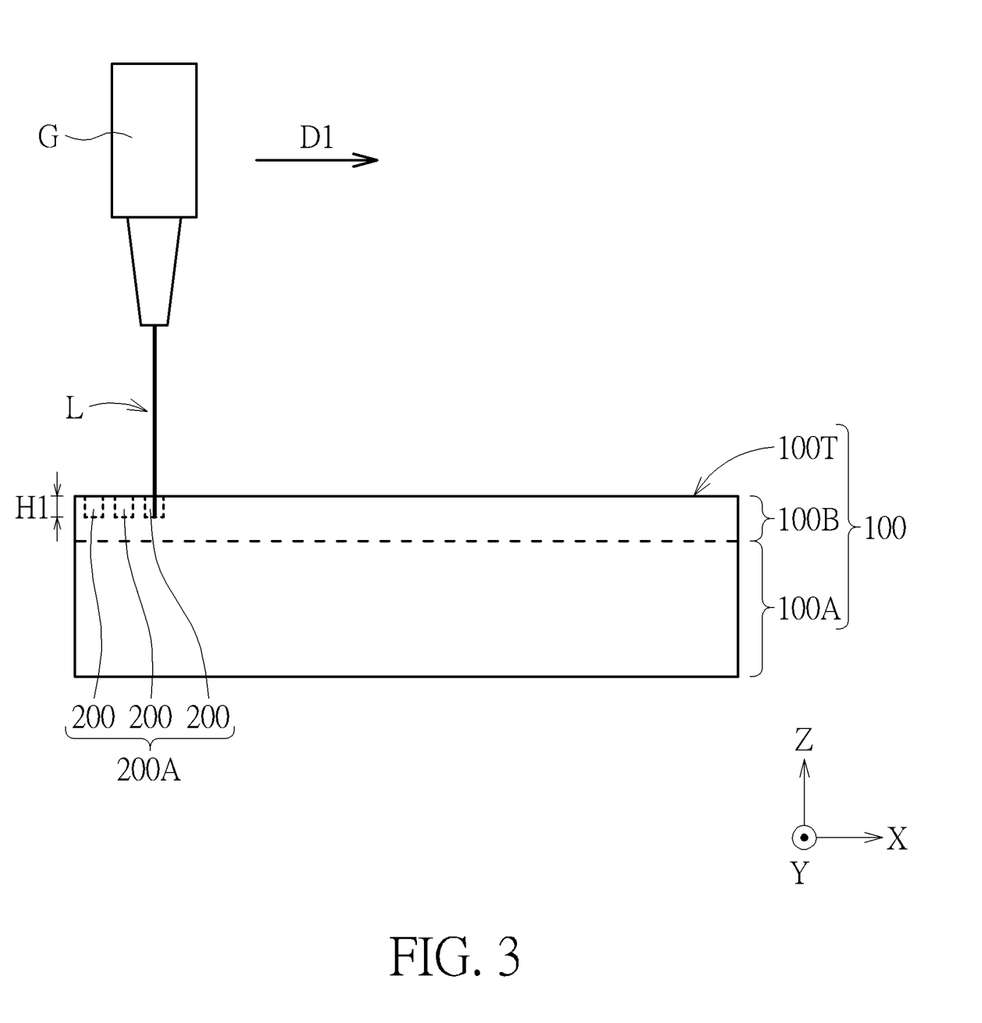
FIG. 3 illustrates a cross-sectional view of performing the first laser process according to an embodiment of the present invention.

FIG. 3 illustrates a cross-sectional view of the first laser process according to an embodiment of the present invention. As shown in FIG. 3, when carrying out the first laser process, a plurality of first optimized regions 200 are formed on the main surface 100T and in the surface layer 100B of the wafer 100, and the first optimized regions 200 form the first optimized array 200A. In one embodiment, the first laser process has a first focal offset distance of H1 extending along a direction from the main surface 100T toward the base layer 100A, and the first focal offset distance H1 is constant or almost constant because of many variables such as the wafer surface roughness, the concentration difference, the laser precision and the Z-axis precision. On the horizontal plane, the modified main surface 100T and the modified surface layer 100B have periodic changes in the horizontal plane to facilitate the subsequently generated stress to be released horizontally when the first focal offset distance H1 is constant or almost constant.

The first focal offset distance H1 of the first laser process may be located under the main surface 100T, in the surface layer 100B and deep into the surface layer 100B by about 0.01 μm to 50 μm. In one embodiment, the pulse frequency of the first laser process is 1 kHz to 2 MHz, or 10 kHz to 100 kHz, but the present invention is not limited thereto. According to different demands, the pulse frequency may be adjusted according to the types of the material and the lateral size of the optimized region. The pulse width may be 100 femtoseconds to 500 nanoseconds, or 0.2 nanoseconds (i.e. 200 picoseconds) to 10 nanoseconds, but the present invention is not limited thereto. When the pulse width of the laser is short, such as 300 picoseconds, it may go with a high pulse frequency, such as above MHz level. The pulse energy of the first laser process may be from 600 μJ/shot to 20 μJ/shot. It should be noted that the pulse energy referred to in the present invention is the energy transmitted by the laser in each pulse, and the energy received by the irradiated surface of the wafer per unit time is not only related to the pulse energy, but also to the pulse width and to the pulse frequency. Specifically speaking, the energy (μJ/ns) received by the irradiated surface of the wafer 100 per unit time may be obtained by dividing the pulse energy by the pulse width. For a laser device with a given power, the pulse energy decreases when the pulse frequency increases. In addition, the laser peak power is higher if the laser pulse width is adjusted from the nanosecond level to a picosecond level or to a femtosecond level, thus producing a stronger photomechanical effect and a weaker photothermal effect, which makes it easier to manufacture high-defect-density arrays, so the laser pulse energy used to manufacture optimized arrays has a certain relationship with the surface roughness of the wafer 100.

FIG. 4 illustrates a top view of the wafer 100 following the practice of the first laser process according to an embodiment of the present invention. Following the practice of the first laser process, a plurality of first optimized regions 200 is formed on the main surface 100T and in the surface layer 100B of the wafer 100, and the top surfaces of the first optimized regions 200 are exposed surfaces. The bottom surfaces of the first optimized regions 200 of the present embodiment are substantially on the same horizontal plane, for example, parallel to the plane defined by the X-axis and the Y-axis. In other words, the focal depth (parallel to the Z-axis) of each optimized region is constant. The first optimization regions 200 shown in FIG. 4 are distributed on the main surface 100T shown in FIG. 4 (that is, the upper surface parallel to the X-axis and to the Y-axis), so multiple first optimized regions 200 on the same horizontal plane form a first optimized array 200A when the wafer 100 is viewed from above, and the first optimized array 200A has a first depth (not shown). Specifically speaking, the first depth is the depth at which the first optimized array is located under the main surface 100T, that is, the first focal offset distance H1 (not shown).

The first optimized regions 200 are specific regions of the wafer 100 modified by the laser. The first optimized regions 200 include a lattice-modified region, a predetermined removed region, or a combination thereof. The lattice-modified region includes at least one of polycrystalline region and an amorphous region. The material in the predetermined removed region is removed in the subsequent process, and becomes void or form a recessed region. Although it is defined a recessed region here, in fact, the recessed region may only have a depth variation of a few nanometers, and the depth may be smaller or larger, and but the present invention is not limited thereto. Depending on the energy and time of the laser application, the defect density, the number of voids, the quantity of grain boundaries and/or the crystal form of the first optimized region 200 may be different from other regions of the surface layer 100B which are not modified by the laser.

According to an embodiment of the present invention, the crystal form and the quantity of grain boundaries of the optimized regions 200 of the wafer 100 are different from the crystal form and the quantity of grain boundaries of the unmodified surface layer 100B of the wafer 100, such as the crystalline form of the first optimized region 200 is polycrystalline and has many grain boundaries, but the crystalline form of the surface layer 100B outside the first optimized region 200 is single crystal with almost no grain boundaries, or the crystal and the compositions of the first optimized regions 200 are different from the wafer 100, but the present invention is not limited thereto. The crystal form of the first optimized region 200 may be different from that of the other regions of the surface layer 100B of the wafer 100, for example, the crystal form of the first optimized regions 200 is polycrystalline or amorphous, and the crystal form of the rest of the surface layer 100B of the wafer 100 is single crystal, but the present invention is not limited thereto.

According to the energy and the size and diameter of the light spot applied by the laser, the projected area of each first optimized region 200 may be 1 $\mu m^2$ to $10^4$ $\mu m^2$. For example, the maximum unidirectional size of a laser spot is referred to as a scanning width T. For example, the scanning width T is 1 μm to 500 μm.

Adjacent first optimized regions 200 may be separated from each other. According to an embodiment, as shown in FIG. 4, the first optimized regions 200 are individually distributed along the X-axis so that the adjacent first optimized regions 200 are not in direct contact. The gap distance between adjacent first optimized regions 200 is called a scanning pitch p. For example, the scanning pitch p is 5 μm to 1000 μm. By setting the first optimized region 200, for example, by setting the disconnected and periodically distributed first optimized regions 200, there is an untreated region 110 (for example, a region of the surface layer 100B which is not processed by the laser) between two adjacent first optimized regions 200), so that the first optimized regions 200 along with the adjacent untreated regions 110 on the same horizontal plane may together be effective for buffering a stress, and serve as a stress-buffering layer for subsequent epitaxial growth.

Figure 4A:
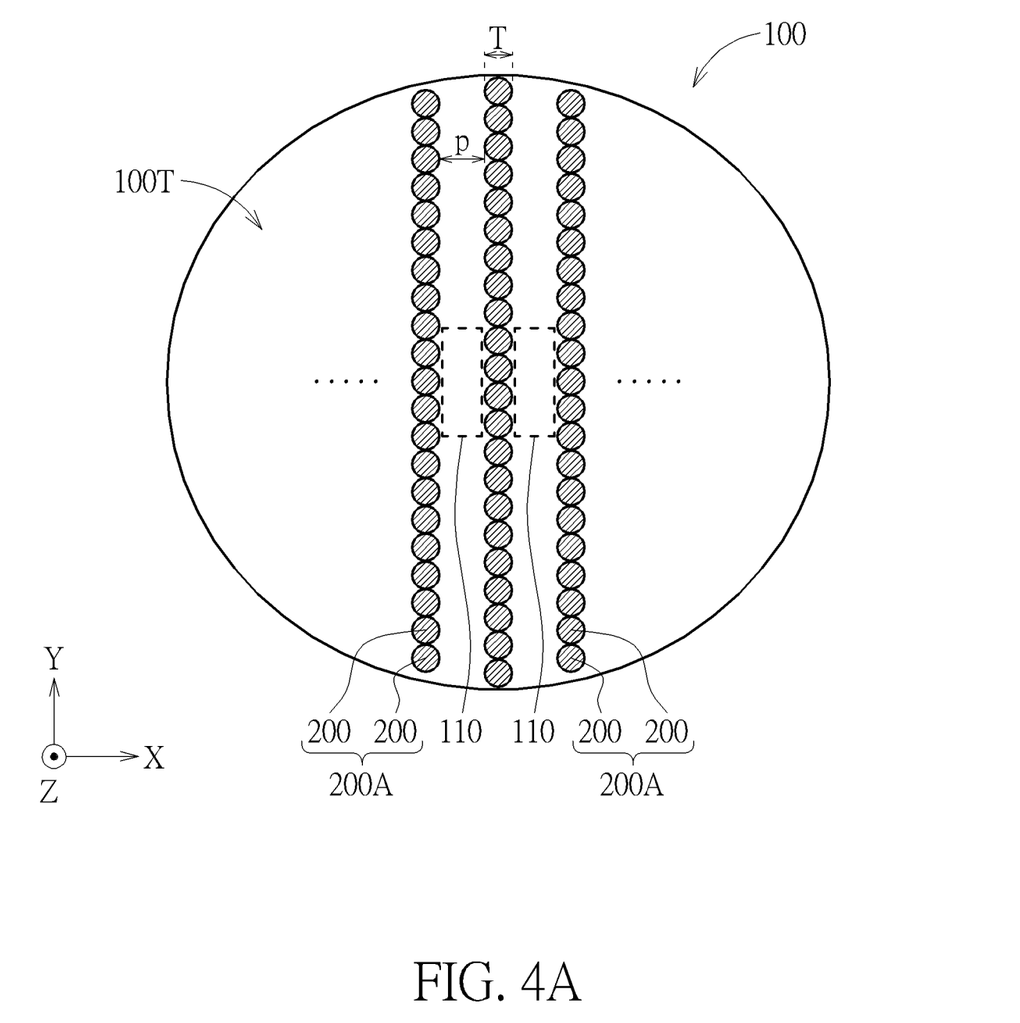
Figure 4B:
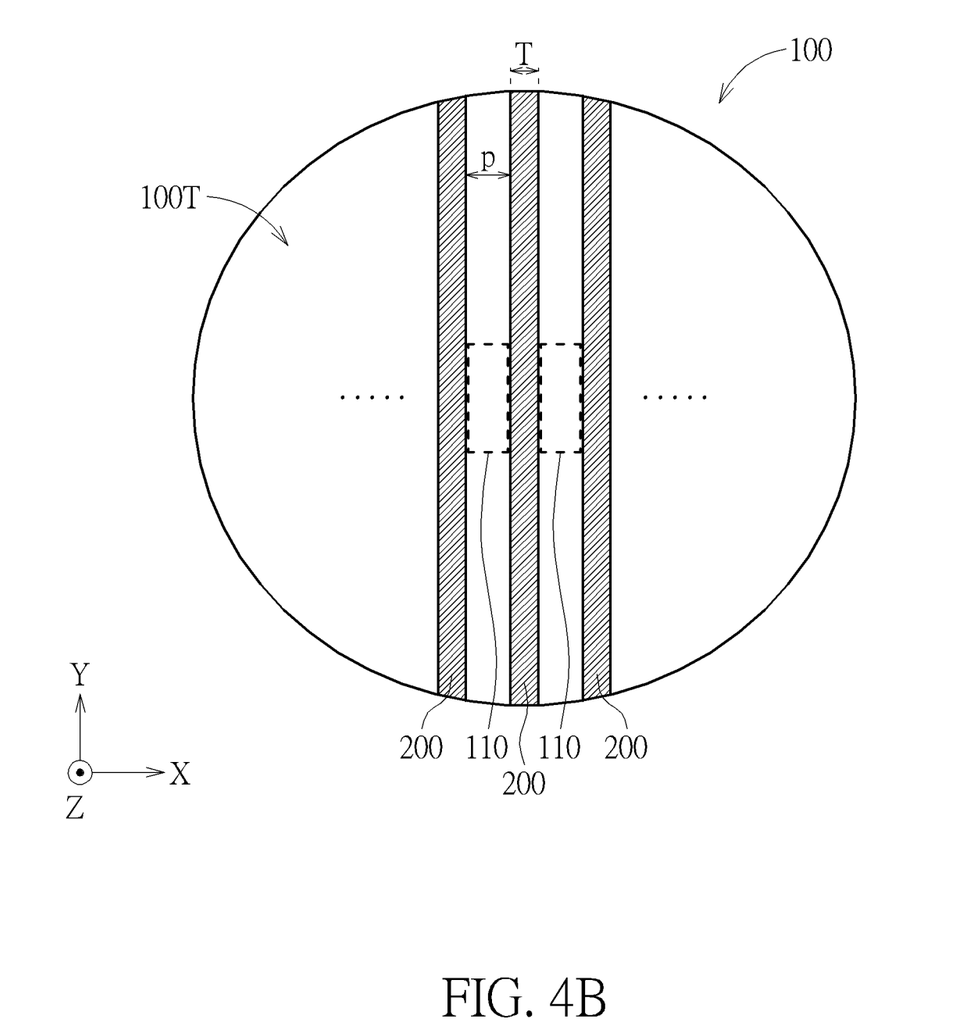

According to an embodiment, as shown in FIG. 4A, adjacent first optimized regions 200 may be in partial contact with each other, so that each first optimized region 200 is continuously distributed along at least one direction, for example along a direction parallel to the Y-axis direction. At this time, the narrowest space distance in the direction parallel to the X-axis between adjacent first optimized regions 200 is referred to as the scanning pitch p. For example, the scanning pitch p is 5 μm to 1000 μm. According to another embodiment, as shown in FIG. 4B, the first optimized regions 200 may converge into a continuous strip pattern, so that each first optimized region 200 is continuously distributed along at least one direction, for example, along a groove parallel to the Y-axis direction. The space distance between adjacent first optimized regions 200 is referred to as the scanning pitch p. For example, the scanning pitch p is 5 μm to 1000 μm.

In this embodiment, the adjacent first optimized regions 200 may be regarded as what consists of lattice-modified regions, predetermined removed regions and a combination thereof alternately arranged along at least one direction, and the lattice defect density, the lattice constant, the crystal plane and/or the crystal form of the lattice-modified region may be different from the lattice defect density, the lattice constant, the crystal plane and/or the crystal form of the predetermined removed region. At this time, as long as at least one of the lattice-modified region or the predetermined removed region has a periodic distribution, the first optimization array 200A formed thereof may absorb the undesirable stresses at the interface between the wafer 100 and the epitaxial layer (not shown). The scanning width T and the scan pitch p may be adjusted in conjunction with the subsequent epitaxial process.

Figure 5:
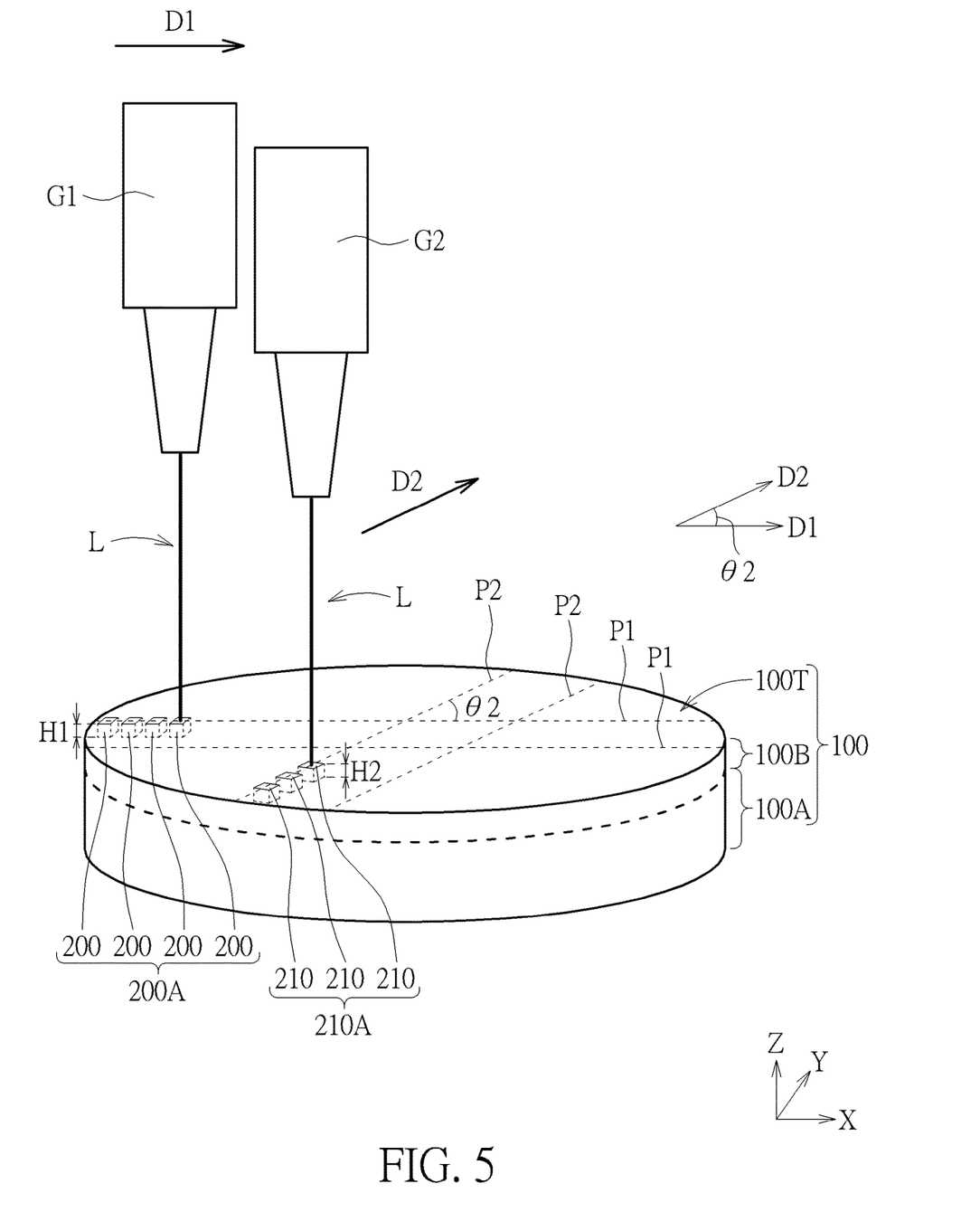
FIG. 5 illustrates a perspective view of the practice of the first laser process and of the second laser process according to an embodiment of the present invention.

FIG. 5 illustrates a perspective view of the practice of the first laser process and of the second laser process according to an embodiment of the present invention. During the practice of the first laser process, the laser L comprehensively irradiates the main surface 100T and the surface layer 100B along multiple paths parallel to the first direction D1 (such as the first scanning path P1 and other parallel paths). During the practice of the second laser process, the laser L comprehensively irradiates the surface layer 100B along multiple paths parallel to the second direction D2 (such as the second scanning path P2 and other parallel paths). According to an embodiment, please refer to FIG. 4, for example, the laser L is generated by the first laser generating device G1, and the surface layer 100B of the wafer 100 is irradiated with the laser L to form a plurality of exposed first optimized regions 200. The first optimized regions 200 form a first optimized array 200A on a horizontal plane. For example, similarly the second laser L is generated by the second generating device G2, and the surface layer 100B of the wafer 100 is irradiated with the laser L to form a plurality of exposed second optimized regions 210. The second optimized regions 210 form a second optimized array 210A on a horizontal plane.

In FIG. 5, there is an included angle θ2 between the first scanning path P1 extending along the first direction D1 and the second scanning path P2 extending along the second direction D2, and the included angle θ2 may be 30° to 120°. In one embodiment, the first laser process and the second laser process are carried out simultaneously. Or, in another embodiment, the first laser process is carried out prior to the second laser process.

Similar to the embodiment shown in FIG. 4, the second laser process has a second focal offset distance H2 extending from the main surface 100T toward the base layer 100A, and the second focal offset distance H2 is constant. The second focal offset distance H2 of the second laser process may be located below the main surface 100T, about 0.01 μm to 50 μm deep in the surface layer 100B. The focal depth of the first laser process and the second laser process may be the same or different from each other. According to an embodiment, these laser processes simultaneously create periodic structural changes in the horizontal and vertical directions on the main surface 100T and in the surface layer 100B if the focal depths of the first laser process, of the optional second laser process, or an optional $n^{th}$ laser process respectively have an offset at different focal depth H1, different focal depth H2 and different focal depth Hn. These different focal depths H1, H2 . . . . Hn are beneficial to collectively withstand the subsequently generated higher, stronger or greater stresses.

According to an embodiment, the first laser process and the second laser process are carried out sequentially and repeatedly until a predetermined pattern or array is formed. For example, the second laser process is carried out along another path (such as the second scanning path P2) after the first laser process is carried out along a certain path (such as the first scanning path P1) then the above processes are carried out repeatedly.

In FIG. 5, the practice of the first laser process and of the second laser process include the simultaneous practice of the both and the subsequent practice of an optional annealing treatment to irradiate the main surface 100T or the surface layer 100B of the wafer 100 with the laser L, thereby changing the crystallinity of the surface layer 100B. Or the practice of the first laser process is carried out prior to the practice of an optional first annealing treatment thereby eliminating the stress generated by the laser process by means of the annealing treatment. Later, the practice of the second laser process is followed by an optional second annealing treatment to prevent the accumulation of the stress. It should be noted that, a slight shift (for example, less than 5 Å) in the lattice on the penetration path is inevitable although a laser process of a specific wavelength may penetrate the wafer. If the first annealing treatment is carried out prior to the second laser process, it is beneficial to ensure that the slightly shifted lattice is repaired and restored to the previous state of the lattice before the subsequent laser process, so as to control the accuracy of the second laser process.

In one embodiment, the first laser process and the second laser process have the same pulse energy, therefore, the resultant first-optimized regions and second-optimized regions have substantially the same or similar defect density, void quantity, grain boundary quantity and/or crystal morphology. In addition, depending on actual demands, the laser parameters of the first laser process and of the second laser process, such as the pulse energy, the pulse width, and the spot size, may be the same or different.

Figure 6:
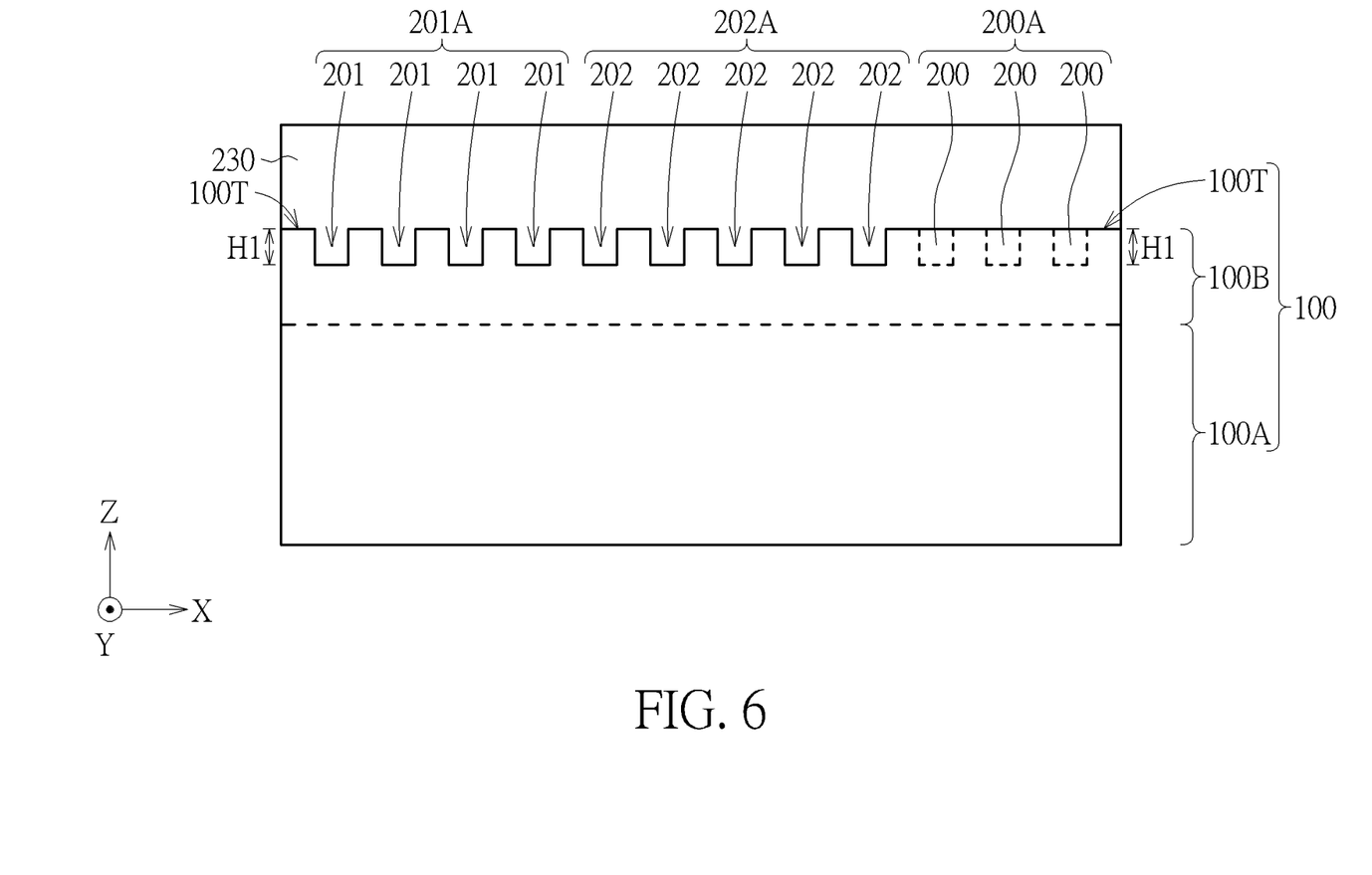
FIG. 6 illustrates a schematic cross-sectional view of a wafer 100 after a removal process and an epitaxial process according to an embodiment of the present invention.

In one embodiment, at least some of the above-mentioned optimized regions (such as the first optimized regions 100 and the second optimized regions 200) are predetermined removed regions, so an etching process may be further carried out to remove some of the materials in the predetermined removed regions to form a recessed region 201 as shown in FIG. 6.

FIG. 6 illustrates a schematic cross-sectional view of a wafer 100 after a removal process and an epitaxial process according to an embodiment of the present invention. After the laser processes, the wafer 100 may be further subjected to an optional etching process. The etching process removes the optimized regions of the wafer 100, such as the first optimized regions 200, to form a plurality of recessed regions 201 in the surface layer 100B. The recessed regions 201 together form at least one recessed region array 201A. The etching process makes recessed each region 201 form a three-dimensional pattern 202. These three-dimensional patterns 202 together form at least one stress-relieving array 202A. A recessed region 201 or a three-dimensional pattern 202 may be a cavity, a groove, or a combination thereof formed by the etching, and respectively has a first focal offset distance H1. The cavities may have substantially the same dimensions in the directions of the X and Y axes, but the grooves may have substantially greater dimensions in one of the X and Y directions than in the other. From a top view, the cavities may have various regular or irregular geometric shapes, such as triangles, rectangles, circles, ellipses, egg shapes, or polygons, but the present invention is not limited thereto.

The etching process may use a dry etching, a wet etching, or a combination thereof. The etching recipe may be an acid etching, an alkaline etching, a pH-buffered etching, or a combination thereof. The acid etching may use hydrofluoric acid, nitric acid, or a mixture thereof. The alkaline etching may use tetramethylammonium hydroxide (TMAH), fluoride salts, or a mixture thereof. For a pH-buffer etching, a mixture of hydrofluoric acid and fluoride salt may be used, and a pH-buffering agent may be optionally added.

After the etching process is completed, an epitaxial layer 230 may be further grown on the wafer 100. The epitaxial layer 230 is in direct contact with the main surface 100T, and fills in the recessed region 201 or covers the first optimized region 200. Due to the presence of the recessed regions 201, they may relief the stress between the epitaxial layer 230 and the base layer 100A, to prevent the epitaxial layer 230 from bending.

Still as shown in FIG. 6, the method for a wafer treatment of the present invention may include multiple steps. In a first step, the wafer 100 is provided. In the second step, at least one laser process is carried out to comprehensively irradiate the surface layer 100B with a laser, so as to generate a plurality of defects in the surface layer 100B, and the defects form at least one optimized array. According to different demands, the method for a wafer treatment further includes the practice of an annealing step after the practice of the second step to irradiate the main surface 100T or the surface layer 100B of the wafer 100 with a laser, thereby changing the crystallinity of the surface layer 100B. According to different demands, the method for a wafer treatment further includes the practice of an etching step after the practice of the second step, to process the main surface 100T or the surface layer 100B of the wafer 100 by using the etching process, thereby generating a recessed region 201, a recessed region array 201A, a three-dimensional pattern 202, and/or a stress-relieving array 202A. According to different demands, the method for a wafer treatment further includes the practice of a pre-epitaxial treatment step after the practice of the second step, to pass hydrogen gas to thermally treat the main surface 100T or the surface layer 100B of the wafer 100, thereby facilitating the subsequent epitaxial step. An epitaxial layer 230 is grown on the wafer 100 in the subsequent epitaxial step, and the epitaxial layer 230 directly contacts the main surface 100T.

Figure 7:
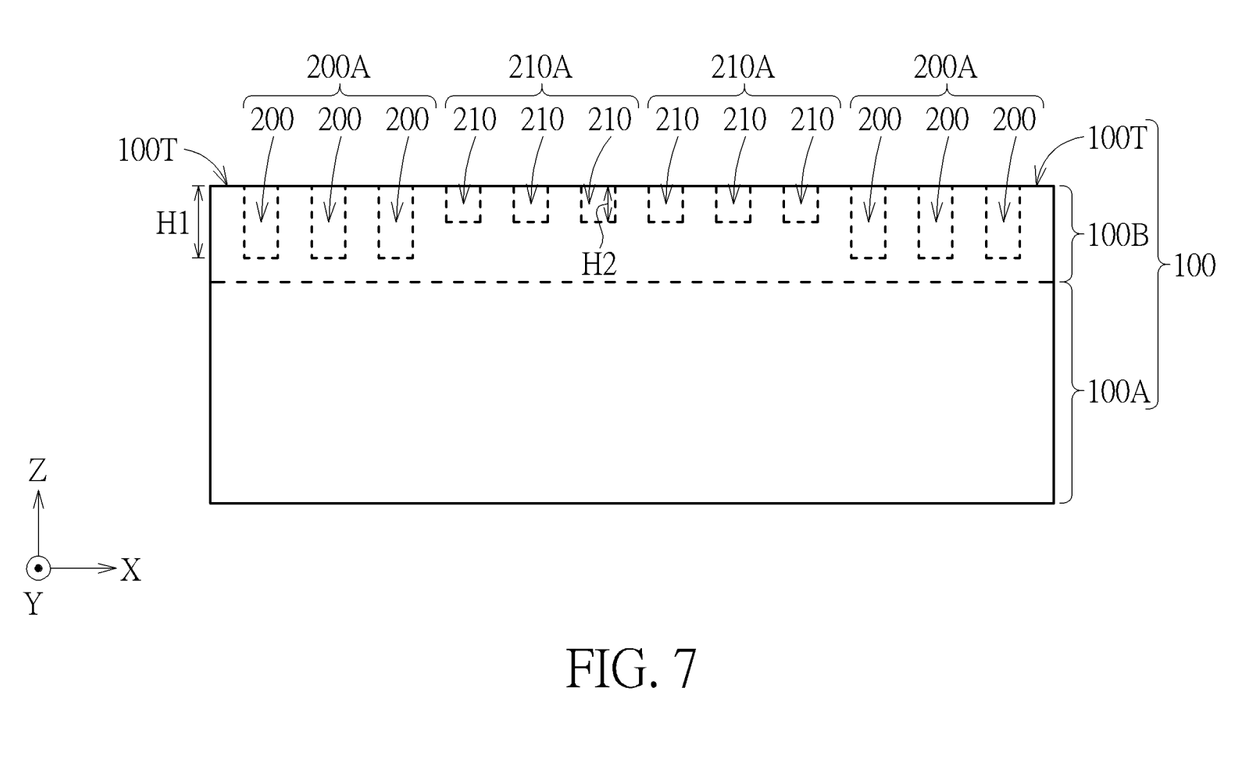
FIG. 7 illustrates a schematic cross-sectional view of another embodiment of the present invention after the wafer is subjected to at least one laser process.

FIG. 7 illustrates a schematic cross-sectional view of another embodiment of the present invention after the wafer 100 is subjected to at least one laser process. There is a plurality of exposed first optimized regions 200 in the surface layer 100B of the wafer 100, and the first optimized regions 200 are distributed on a horizontal plane to form a first optimized array 200A. The bottom surface of the first optimized array 200A has a first depth H1, and there is a plurality of exposed second optimized regions 210 on the surface layer 100B of the wafer 100. The bottom surfaces of the second optimized regions 210 are distributed on another horizontal plane to form a second optimized array 210A. The bottom surface of the second optimized array 210A has a second depth H2. In this embodiment, the first depth H1 is different from the second depth H2, and the first depth H1 is greater than the second depth H2, so that regular patterns with different depths are formed. It should be noted that the first optimized regions 200 and the second optimized regions 202 shown in FIG. 7 are not only distributed on the section shown in FIG. 7 but also the first optimized regions 200 and the second optimized regions 202 are possible to be distributed on other multiple vertical planes which are parallel to the X-axis and the Z-axis.

Figure 7A:
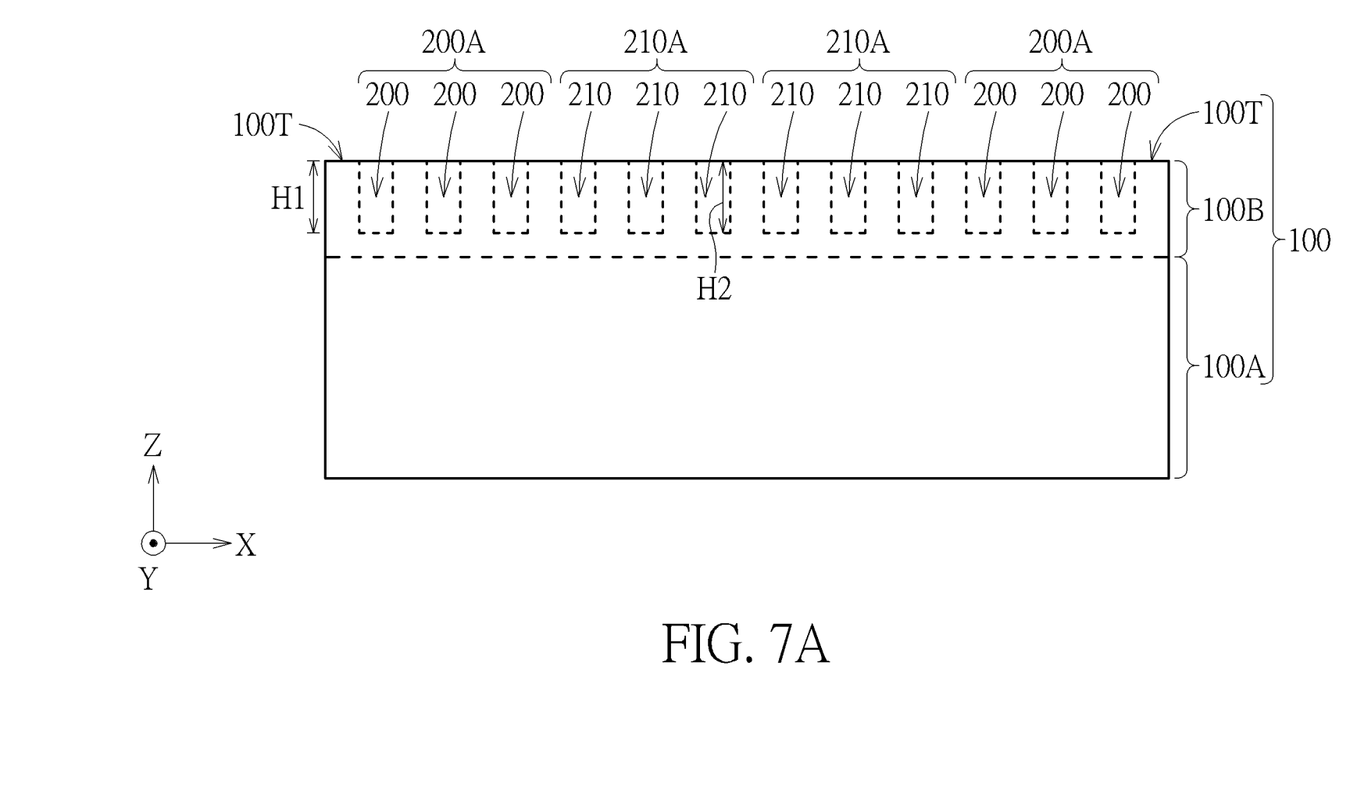
FIG. 7A illustrates a schematic cross-sectional view of the wafer after at least one laser process according to another embodiment of the present invention.

FIG. 7A illustrates a schematic cross-sectional view of the wafer 100 after at least one laser process according to another embodiment of the present invention. In yet another embodiment, the first depth H1 of the bottom surface of the first optimized array 200A may be the same as the second depth H2 of the bottom surface of the second optimized array 210A, and any one of the first optimized regions 200 of the first optimized array 200A is not in contact with any one of the second optimized regions 210 of the second optimized array 210A, and there may be a second optimized region 210 and a second optimized array 210A between any two adjacent first optimized regions 200.

It should be noted that the scanning pitch p of the first laser generator G1 and of the second laser generator device G2 may be adjusted according to the optimized arrays to be formed since the first direction D1 of the first laser process and the second direction D2 of the second laser process are not parallel to each other, that is, a part of the first optimized region 200 and a part of the second optimized region 210 may not overlap in the top view direction of the wafer 100.

Similarly, according to different demands, the method for a wafer treatment of the present invention may further include a third laser process along a third direction (not shown) to form a plurality of exposed third optimized regions (not shown) in the surface layer 100B to form a third optimized array (not shown) on a certain horizontal plane, so that the surface layer 100B of the wafer 100 has the first optimized array 200A, the second optimized array 210A and the third optimized array (not shown) at the same time.

Each optimized array has an array unit length and an array unit width. The array unit length is parallel to the Y-axis, and the array unit width is parallel to the X-axis. In one embodiment, the array unit length and the array unit width are the same, therefore, the optimized array may be considered to be composed of a plurality of defective square units. In another embodiment, the array unit length is greater than the array unit width. In this way, the optimized array may be considered to be composed of a plurality of defective rectangular units. In yet another embodiment, there is an included angle of 30° to 60° between the array unit length and the Y-axis, and the array unit width is parallel to the X-axis. In this way, the optimized array may be regarded as composed of a plurality of defective parallelogram units.

Figure 8:
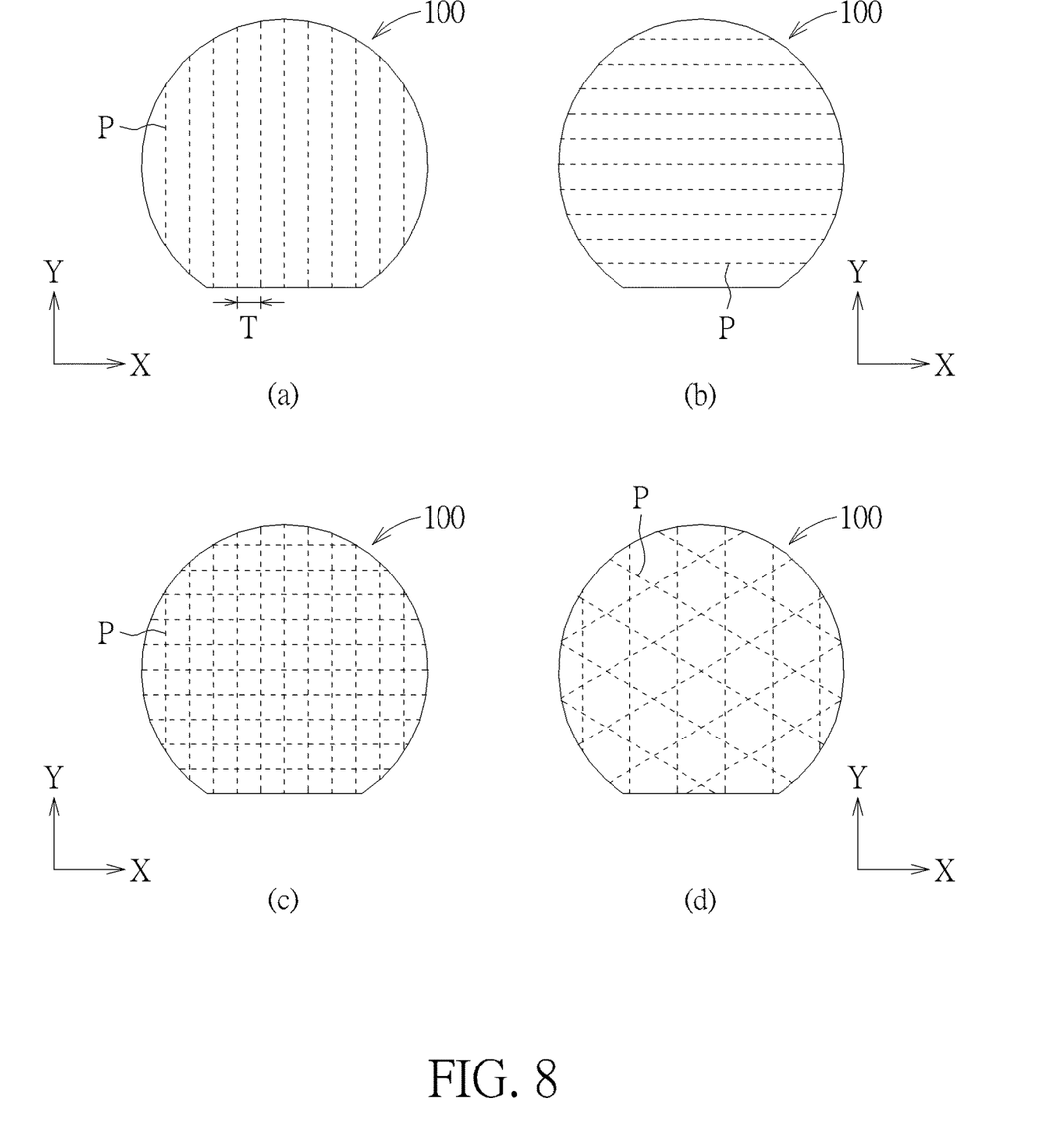
FIG. 8 illustrates a top view of a laser scanning path of a laser process according to different embodiments of the present invention.

FIG. 8 illustrates a top view of a laser scanning path for the practice of a laser process according to different embodiments of the present invention. The scanning paths P for the practice of two or more laser processes in the present invention may be the same or different from each other. As shown in FIG. 8(a), the scanning path P may be linear along the Y-axis, and there is a scanning pitch p between two adjacent scanning paths P. The scanning pitch p of the laser is the space distance of the laser L which is emitted by the laser generator device G. In one embodiment, the scanning pitch p of the laser may be from 5 μm to 1000 μm. As shown in FIG. 8(b), the scanning path P is linear along the X-axis. As shown in FIG. 8(c), in the case of the practice of more than two laser processes, the scanning path P of the prior laser process may be linear along the Y-axis and the following laser process may be linear along the X-axis, or the prior laser process may be linear along the X-axis and the following laser process may be linear along the Y-axis. As shown in FIG. 8(d), in the case of the practice of more than three laser processes, the scanning path P of the prior laser process may be linear along the Y-axis, and then the following two laser processes may scan along other two scanning directions which are different from each other.

According to the above-mentioned embodiments of the present invention, a plurality of optimized regions is formed on the main surface and in the surface layer of a wafer by carrying out a laser process to form at least one optimized array. When the epitaxial layer is subsequently grown on the main surface of the wafer, the optimized array is beneficial for buffering or absorbing stresses originating from the lattice constant mismatch or from the thermal expansion coefficient mismatch between the wafer and the epitaxial layer. Compared with the solution that a buffering epitaxial layer is set on the wafer to solve the aforementioned problems, the present invention has the advantages of simple steps and a lower cost, and the thickness of the semiconductor element may be reduced or even the degree of subsequent wafer thinning may be reduced since no additional growth of buffer epitaxial layer is required. The optimized regions may be removed to become a three-dimensional structure so that more grain boundaries are produced in the surface layer to absorb the stress caused by the lattice mismatch or by the thermal expansion coefficient mismatch so the surface layer may help improve the epitaxial bending and the edge cracking. A periodic change of the surface lattice is formed on the surface of the wafer to facilitate the use of this periodic change to absorb the stress during the subsequent epitaxy, so that the surface layer may simultaneously absorb the stress caused by the material mismatch during the subsequent epitaxial process. The stress caused by the epitaxy is usually the tensile or the compression toward the surface of the wafer. By means of this periodic surface structure, the surface of the wafer may increase the tensile or compressing ability regarding the shallow layer, especially at high temperatures, so it is more applicable for use in the epitaxial applications.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for a wafer treatment, comprising:
    providing a wafer comprising a main surface, a surface layer and a base layer, wherein the surface layer is disposed between the main surface and the base layer, and the surface layer covers the base layer to expose the main surface; and
    performing at least one laser process to comprehensively irradiate the main surface and the surface layer with a first laser, thereby generating a plurality of laser-treated regions on the main surface and in the surface layer, so that the laser-treated regions form at least one stress-relieving array, wherein performing the at least one laser process comprises:
        performing a first laser process to irradiate the main surface and the surface layer with the first laser, so that the plurality of laser-treated regions extends along a first direction, and a first focal offset distance of the first laser extends 50 µm along a direction from the main surface toward the base layer, and the first focal offset distance is constant.

2. The method for a wafer treatment of claim 1, wherein the laser-treated regions comprise one of a lattice-modified region and a predetermined removed region.

3. The method for a wafer treatment of claim 2, wherein the lattice-modified region comprises at least one of a polycrystalline region and an amorphous region.

4. The method for a wafer treatment of claim 1, wherein the wafer comprises at least one of silicon, silicon carbide, gallium arsenide, and a sapphire material.

5. The method for a wafer treatment of claim 1, wherein performing the at least one laser process further comprises:
    performing a second laser process to irradiate the surface layer with a second laser, so that the plurality of laser-treated regions extends along a second direction, and a second focal offset distance of the second laser extends 50 µm along the direction from the main surface toward the base layer, and the second focal offset distance is constant,
    wherein, there is an included angle between the first direction and the second direction, and the included angle is 30° to 120°, and the first focal offset distance of the first laser process and the second focal offset distance of the second laser process are the same or different from each other,
    wherein, the first laser process and the second laser process are performed sequentially and repeatedly.

6. The method for a wafer treatment of claim 5, wherein the first laser process and the second laser process are performed simultaneously, or the first laser process is performed prior to the second laser process.

7. The method for a wafer treatment of claim 1, after performing the at least one laser process, further comprising:
    performing an etching process to remove the plurality of laser-treated regions to form a plurality of recessed regions in the surface layer, so that the plurality of recessed regions forms the at least one stress-relieving array of at least one three-dimensional pattern.

8. The method for a wafer treatment of claim 1, wherein performing the at least one laser process is performing an annealing treatment, thereby changing the crystallinity of the main surface and of the surface layer.

9. The method for a wafer treatment of claim 1, after performing the at least one laser process, further comprising:
    growing an epitaxial layer in direct contact with the main surface.

* * * * *